US009997317B2

(12) United States Patent
Liu et al.

(10) Patent No.: US 9,997,317 B2
(45) Date of Patent: Jun. 12, 2018

(54) ISOLATED CONTROL CIRCUIT AND DRIVER FOR MICRO-ELECTROMECHANICAL SYSTEM SWITCH

(71) Applicant: General Electric Company, Schnectady, NY (US)

(72) Inventors: Yanfei Liu, Kingston (CA); Glenn Scott Claydon, Wynantskill, NY (US); Christopher Fred Keimel, Schenectady, NY (US); Christian Michael Giovanniello, Jr., Schnectady, NY (US)

(73) Assignee: General Electric Company, Schenectady, NY (US)

( * ) Notice: Subject to any disclaimer, the term of this patent is extended or adjusted under 35 U.S.C. 154(b) by 309 days.

(21) Appl. No.: 14/919,833

(22) Filed: Oct. 22, 2015

(65) Prior Publication Data

US 2017/0117111 A1    Apr. 27, 2017

(51) Int. Cl.
*H01H 47/02*     (2006.01)
*G01R 23/15*     (2006.01)
(Continued)

(52) U.S. Cl.
CPC ............. *H01H 47/02* (2013.01); *G01R 23/15* (2013.01); *H01H 9/542* (2013.01);
(Continued)

(58) Field of Classification Search
CPC .... H01H 47/02; H01H 9/542; H01H 59/0009; H01H 2071/0008; G01R 23/15; H03K 2217/0063
See application file for complete search history.

(56) References Cited

U.S. PATENT DOCUMENTS

| 5,736,916 A | 4/1998 | Vlahu |
| 5,754,732 A | 5/1998 | Vlahu |

(Continued)

FOREIGN PATENT DOCUMENTS

| EP | 0708529 A2 | 4/1996 |
| EP | 1930922 A2 | 6/2008 |

(Continued)

OTHER PUBLICATIONS

PCT Search Report and Written Opinion issued in connection with corresponding PCT Application No. PCT/US16/57509 dated Feb. 3, 2017.

*Primary Examiner* — Zeev V Kitov
(74) *Attorney, Agent, or Firm* — Ziolkowski Patent Solutions Group, SC; Jean K. Testa

(57) ABSTRACT

A switching system includes a control circuit that receives On-Off signals indicative of a desired operating state of a switch. The control circuit includes an oscillator that generates a first electrical pulse responsive having a first signal characteristic or a second signal characteristic that is determined by the received On-Off signal, which may be related to a frequency or duty cycle of the pulse. A pulse transformer connected to the oscillator receives the first electrical pulse and outputs a second electrical pulse having the same one of the first signal characteristic and the second signal characteristic as the first electrical pulse. A pulse detection circuit in the control circuit receives the second electrical pulse, determines whether the second electrical pulse has the first signal characteristic or the second signal characteristic, and controls transmission of power and control signals to the switch based on this determination.

20 Claims, 7 Drawing Sheets

(51) Int. Cl.
   *H01H 9/54*   (2006.01)
   *H01H 59/00*  (2006.01)
   *H01H 71/00*  (2006.01)

(52) U.S. Cl.
   CPC ... *H01H 59/0009* (2013.01); *H01H 2071/008* (2013.01); *H03K 2217/009* (2013.01); *H03K 2217/0063* (2013.01)

(56) References Cited

U.S. PATENT DOCUMENTS

| | | | |
|---|---|---|---|
| 5,943,223 A * | 8/1999 | Pond | H02M 1/00 363/15 |
| 6,975,193 B2 | 12/2005 | Knieser et al. | |
| 8,101,898 B2 | 1/2012 | Koste et al. | |
| 8,659,326 B1 | 2/2014 | Claydon et al. | |
| 8,749,237 B2 | 6/2014 | Iannotti et al. | |
| 8,884,657 B2 | 11/2014 | Gan et al. | |
| 8,908,400 B2 * | 12/2014 | Lisi | H02J 5/005 363/127 |
| 2006/0260400 A1 | 11/2006 | Goldstein | |
| 2012/0104867 A1 * | 5/2012 | Mudrick | H02J 7/025 307/104 |
| 2013/0271187 A1 * | 10/2013 | Hayashi | H03K 17/063 327/109 |
| 2014/0117869 A1 * | 5/2014 | Lee | H05B 37/0272 315/223 |

FOREIGN PATENT DOCUMENTS

| | | |
|---|---|---|
| EP | 1965404 A2 | 9/2008 |
| EP | 2541568 A1 | 1/2013 |
| WO | 2014135209 A1 | 9/2014 |

* cited by examiner

ISOLATED CONTROL CIRCUIT AND DRIVER FOR MICRO-ELECTROMECHANICAL SYSTEM SWITCH

BACKGROUND OF THE INVENTION

Embodiments of the invention relate generally to a switching system for On-Off switching of a current in a current path, and more particularly to micro-electromechanical system (MEMS) based switching devices.

Relays are electrically operated switches used to selectively control the flow of current between circuits so as to provide electrical isolation between a control circuit and one or more controlled circuits. Various types of relays are known and may be utilized based on the system and environment in which the relay is implemented, with electromechanical relays and solid-state relays being two common types of relays.

Electromechanical relays are switching devices typically used to control high power devices. Such relays generally comprise two primary components—a movable conductive cantilever beam and an electromagnetic coil. When activated, the electromagnetic coil exerts a magnetic force on the beam that causes the beam to be pulled toward the coil, down onto an electrical contact, closing the relay. In one type of structure, the beam itself acts as the second contact and a wire, passing current through the device. In a second type of structure, the beam spans two contacts, passing current only through a small portion of itself. Electromechanical relays beneficially provide the ability to withstand momentary overload and have a low "on" state resistance. However, conventional electromechanical relays may be large in size may and thus necessitate use of a large force to activate the switching mechanism. Additionally, electromechanical relays generally operate at relatively slow speeds and, when the beam and contacts of the relay are physically separated, an arc can sometimes form therebetween, which arc allows current to continue to flow through the relay until the current in the circuit ceases, while damaging the contacts.

Solid-state relays (SSR) are an electronic switching device that switches on or off when a small external voltage is applied across its control terminals. SSRs include a sensor which responds to an appropriate input (control signal), a solid-state electronic switching device (e.g., thyristor, transistor, etc.) which switches power to the load circuitry, and a coupling mechanism to enable the control signal to activate the switch without mechanical parts. SSRs beneficially provide fast switching speeds compared with electromechanical relays and have no physical contacts to wear out (i.e., no moving parts), although it is recognized that SSRs have a lower ability to withstand momentary overload, compared with electromechanical contacts, and have a higher "on" state resistance. Additionally, since solid-state switches do not create a physical gap between contacts when they are switched into a non-conducting state, they experience leakage current when nominally non-conducting. Furthermore, solid-state switches operating in a conducting state experience a voltage drop due to internal resistances. Both the voltage drop and leakage current contribute to power dissipation and the generation of excess heat under normal operating circumstances, which may be detrimental to switch performance and life and/or necessitate the use of large, expensive heat sinks when passing high current loads.

Micro-electromechanical systems relays (MEMS relays) have been proposed as an alternative to SSRs with most of the benefits of conventional electromechanical relays but sized to fit the needs of modern electronic systems. In such MEMS relays, isolation is needed between the control terminals and power terminals of the MEMS relay—i.e., between a control side of the relay and a power side of the relay that includes a MEMS switch and an auxiliary circuit. In addition, at the power side, electronic circuits are needed to drive the MEMS relay (e.g., MEMS driver), which requires high gate voltage, and a logic circuit is needed to control the switching signals for the MEMS switch and auxiliary circuit. Therefore, it is required to transfer control signals (On-Off signals) and power across an isolation barrier. Traditionally, this isolation is via use of an isolated power supply that powers the high side circuit and an optocoupler that transfers the On-Off control signal; however, the use of such components to provide isolation and the transfer of control signals increases the cost of the MEMS relay and the printed circuit board area taken up thereby.

Therefore, it is desirable to provide a MEMS relay circuit that provides isolation between a low voltage control side and high voltage power side, provides for transfer of power from the low voltage control side to the high voltage power side, and provides for the transmission of control signals from the low voltage control side to the high voltage power side. It is further desirable that such a MEMS relay circuit provides such functionality using low cost electronic circuits that reduce the cost and size of the MEMS relay circuit.

BRIEF DESCRIPTION OF THE INVENTION

In accordance with one aspect of the invention, a switching system includes a switch connectable to a power circuit to receive a load current therefrom. The switching system also includes a control circuit operably connected to the switch to control selective switching of the switch, the control circuit including control input terminals to receive an On-Off signal indicative of a desired operating state of the switch, control output terminals that transmit power and control signals to the switch responsive to the received On-Off signal, and an oscillator coupled to the control input terminals and configured to generate a first electrical pulse responsive to the received On-Off signal, the first electrical pulse having one of a first signal characteristic and a second signal characteristic that is determined by the On-Off signal. The control circuit also includes a pulse transformer connected to receive the first electrical pulse from the oscillator and output a second electrical pulse electrically isolated from the first electrical pulse, the second electrical pulse having the same one of the first signal characteristic and the second signal characteristic as the first electrical pulse. The control circuit further includes a pulse detection circuit configured to receive the second electrical pulse, determine whether the second electrical pulse has the first signal characteristic or the second signal characteristic, and control transmission of power and control signals to the switch based on the determination of the second electrical pulse having the first signal characteristic or the second signal characteristic. The first signal characteristic comprises one of a first frequency and a first duty cycle and the second signal characteristic comprises one of a second frequency and a second duty.

In accordance with another aspect of the invention, a MEMS relay circuit includes a MEMS switching circuit having a MEMS switch moveable between an open position and a closed position to selectively pass a load current therethrough and a MEMS driver circuit configured to provide a drive signal to cause the MEMS switch to move between the open and closed positions. The MEMS relay circuit also includes a control circuit operably connected to the MEMS switching circuit to control switching of the MEMS switch, the control circuit including a pulse transformer configured to isolate a control side of the control circuit from a power side of the control circuit and an oscillator positioned on the control side and configured to generate a first electrical pulse responsive to a received On-Off signal, the first electrical pulse having one of a specified frequency and a specified duty cycle based on the On-Off signal, the specified frequency comprising one of a first frequency and a second frequency and the specified duty cycle comprising one of a first duty cycle and a second duty cycle. The control circuit also includes power and logic circuitry positioned on the power side that is configured to condition an output of the pulse transformer to provide a second electrical pulse having the same one of the specified frequency or specified duty cycle as the first electrical pulse, determine whether the second electrical pulse is at the one of the specified first or second frequency or the specified first or second duty cycle, and transmit one of a logic high signal and a logic low signal to the MEMS switching circuit based on the determination of the second electrical pulse having the specified first or second frequency or the specified first or second duty cycle.

In accordance with yet another aspect of the invention, a method of controlling a micro-electromechanical system (MEMS) relay circuit that includes a MEMS switching circuit, an auxiliary circuit and a control circuit is provided. The method includes receiving at the control circuit one of an Off signal and an On signal comprising a desired operating condition of the MEMS relay circuit and causing an oscillator in the control circuit to generate a first electrical signal responsive to the one of the Off signal and the On signal, the first electrical signal having a first signal characteristic when an On signal is received and having a second signal characteristic when an Off signal is received. The method also includes routing the first electrical signal through a pulse transformer to generate a second electrical signal that is electrically isolated from the first electrical signal, the second electrical signal having the same one of the first signal characteristic or the second signal characteristic as the first electrical signal. The method further includes determining via a pulse detection circuit whether the second electrical signal has the first signal characteristic or the second signal characteristic, outputting a logic high signal from the control circuit to the MEMS switching circuit when the second electrical signal has the first signal characteristic, and outputting a logic low signal from the control circuit to the MEMS switching circuit when the second electrical signal has the second signal characteristic. The logic high signal and the logic low signal selectively cause a voltage to be applied to a MEMS switch of the MEMS switching circuit so as to actuate the MEMS switch between a contacting position and a non-contacting position.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Embodiments of the invention provide a MEMS relay circuit that includes a control circuit that provides electrical isolation between control terminals and power terminals of the MEMS relay circuit and provides appropriate power and control signals to drive the MEMS switch and auxiliary circuit of the relay circuit.

Embodiments of the invention are described below as utilizing MEMS technology; however, it is recognized that such a description is not meant to limit the scope of the invention. That is, MEMS generally refer to micron-scale structures that for example can integrate a multiplicity of functionally distinct elements, for example, mechanical elements, electromechanical elements, sensors, actuators, and electronics, on a common substrate through micro-fabrication technology. It is contemplated, however, that many techniques and structures presently available in MEMS devices will in just a few years be available via nanotechnology-based devices, for example, structures that may be smaller than 100 nanometers in size. Accordingly, even though example embodiments described throughout this document may refer to MEMS-based switching devices, it is submitted that the inventive aspects of the present invention should be broadly construed and should not be limited to micron-sized devices.

Additionally, while embodiments of the invention are described below as being incorporated into relay circuits, it is recognized that such descriptions are not meant to limit the scope of the invention. Instead, it is to be understood that embodiments of the invention may be realized in both relay and circuit protection applications—with circuit protection applications being utilized for the connection and disconnection of a very high current (around 5 times the rated current). Accordingly, use of the term "relay" or "relay circuit" here below is understood to encompass various types of switching systems employed for switching of a current in a current path.

Figure 1:
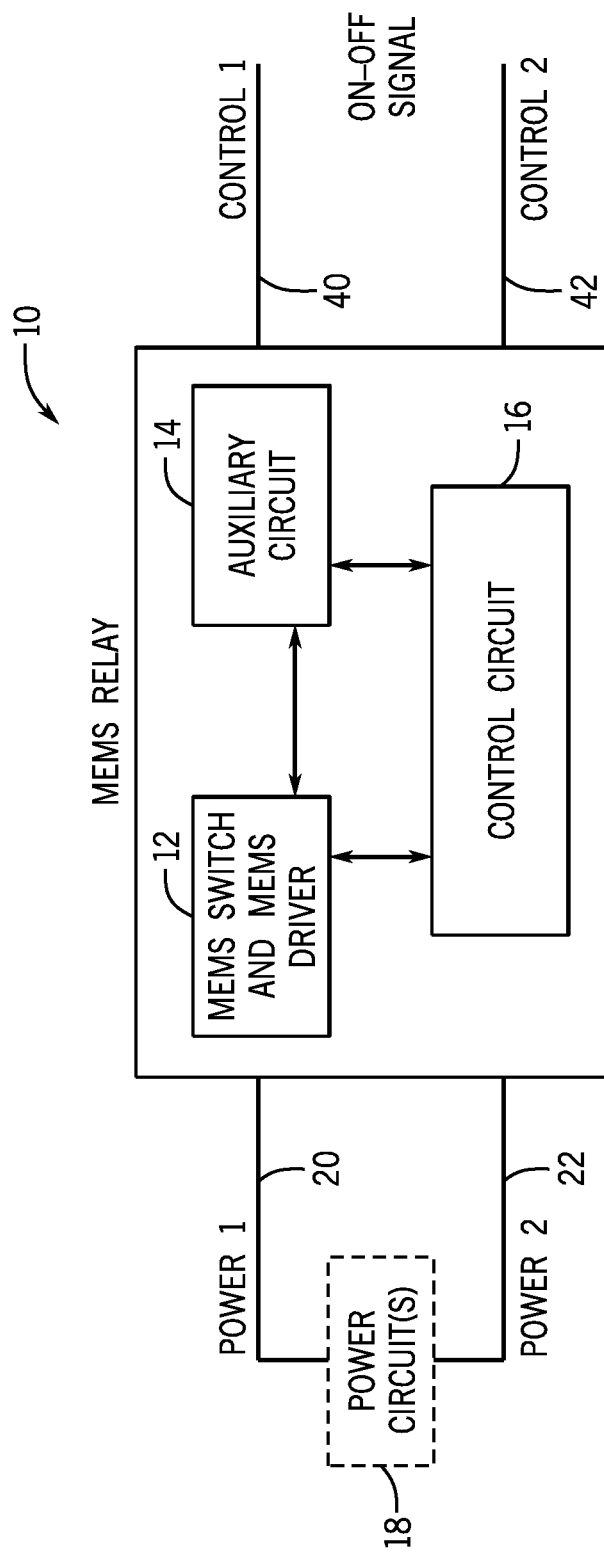
FIG. 1 is a block schematic diagram of a MEMS relay circuit in accordance with an exemplary embodiment of the invention.

Referring now to FIG. 1, a block schematic diagram of a MEMS (Micro-Electromechanical System) relay circuit 10 designed for AC and/or DC applications is illustrated according to an embodiment of the invention. The MEMS relay circuit 10 may be generally described as including MEMS switching circuit 12 (formed of a MEMS switch and an associated driver), an auxiliary circuit 14 to limit the voltage across the MEMS switch when it is turned on and turned off, and a control circuit 16 to ensure proper operation of the MEMS switch. The MEMS relay circuit 10 may be connected to a load circuit/power circuit 18 via first and second power terminals 20, 22. The power circuit 18 may be characterized by a load inductance and a load resistance and may include a power source (not shown) that provides a voltage $V_{LOAD}$ and a power circuit current $I_{LOAD}$—with the MEMS switching circuit 12 being selectively controlled to provide for current flow through the power circuit 18.

Figure 2:
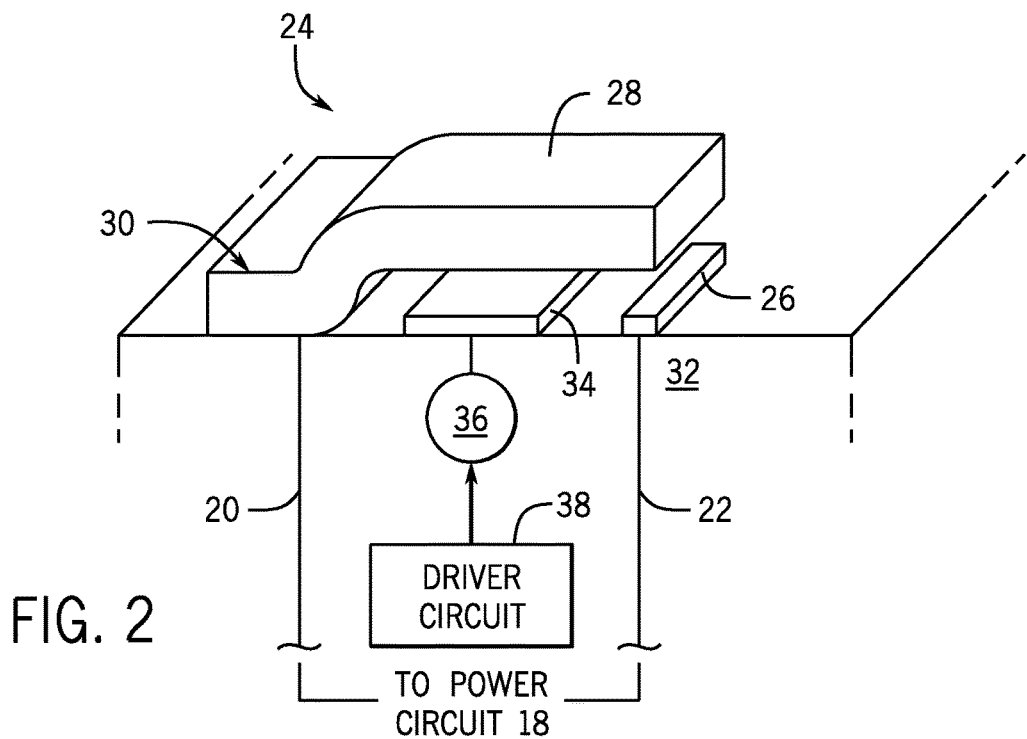
FIG. 2 is a schematic perspective view of a MEMS switch useable in the MEMS relay circuit of FIG. 1 in accordance with an exemplary embodiment.
Figure 3:
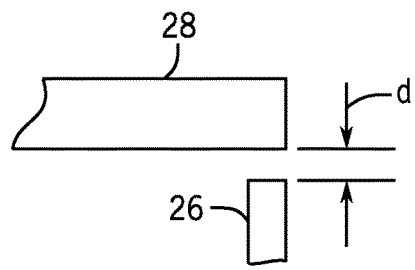
FIG. 3 is a schematic side view of the MEMS switch of FIG. 2 in an open position.
Figure 4:
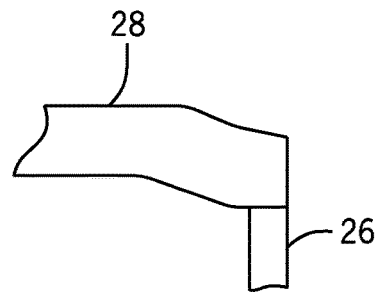
FIG. 4 is a schematic side view of the MEMS switch of FIG. 2 in a closed position.

A more detailed view of the MEMS switch (and the operation thereof) included in MEMS switching circuit 12 is shown in FIGS. 2-4. The exemplary MEMS switch 24 includes a contact 26, which at least partially comprises a conductive material (e.g., a metal), as well as a conductive element, illustrated as a cantilevered beam 28, comprising conductive material (e.g., a metal). The contact 26 and beam 28 may be formed as a micro-electromechanical or nano-electromechanical device with dimensions on the order of ones or tens of nanometers or micrometers. A cantilevered portion of the beam 28 extends over the contact 26, with the beam 28 being supported by an anchor structure 30 from which the cantilevered portion extends. The anchor structure 30 serves to connect the cantilevered portion of the beam 28 to an underlying support structure, such as the illustrated substrate 32.

The MEMS switch 24 also includes an electrode 34 that, when appropriately charged, provides a potential difference between the electrode 34 and the beam 28, resulting in an electrostatic force that pulls the beam toward the electrode and against the contact 26. That is, the electrode 34 may act as a "gate" with respect to the MEMS switch 24, with voltages (referred to as "gate voltages," $V_G$) being applied to the electrode 34 from a gate voltage source 36. As the electrode 34 is charged, a potential difference is established between the electrode 34 and the beam 28, and an electrostatic actuating force acts to pull the beam 28 towards the electrode 34 (and also towards the contact 26) serving to control the opening or closing of the MEMS switch 24. With application of sufficient voltage to the electrode 34, the electrostatic force deforms the beam 28 and thereby displaces the beam from a non-contacting (i.e., open or non-conducting) to a contacting (i.e., closed or conducting). Movement of the beam 28 between the non-contacting or "open" position and the contacting or "closed" position is shown in FIGS. 3 and 4. In the non-contacting or open position shown in FIG. 3, the beam 28 is separated from the contact 26 by a separation distance d, while in the contacting or "closed" position, shown in FIG. 5, the beam 28 comes into electrical contact with the contact 26.

During a switching event (i.e., a movement of the MEMS switch 24 from a non-conducting state to a conducting state or vice versa), the gate voltage $V_G$ provided by gate voltage source 36 may be varied over a switching event time or "switching interval," with a driver circuit 38 functioning to control operation of the gate voltage source 36 in providing the gate voltage. For switching events in which the MEMS switch 24 is being opened, the gate voltage would be decreased over the switching interval, while for switching events in which the MEMS switch 24 is being closed, the gate voltage $V_G$ would be increased over the switching interval. In an exemplary embodiment, the switching interval is approximately 10 microseconds or less in duration.

The contact 26 and beam 28 can be respectively connected to either of the power terminals 20, 22 of the power circuit 18, such that deformation of the beam 28 between the first and second positions acts to respectively pass and interrupt a current therethrough. The beam 28 may be repeatedly moved into and out of contact with the contact 26 at a frequency (either uniform or non-uniform) that is determined by the application for which the MEMS switch 24 is utilized. When the contact 26 and the beam 28 are separated from one another, the voltage difference between the contact and beam is referred to as the "stand-off voltage." Due to the design of the MEMS switch 24, the leakage current between power terminals 20, 22 will be extremely low, e.g., in the pico-Ampere range.

It is noted that while the MEMS switch structure referenced above is described in terms of a solitary MEMS switch 24 having a single moveable element, the MEMS switch structure may include an array of MEMS switches connected in parallel, in series, or both, where each switch of the array includes a moveable element. It is also noted that the MEMS switch structure referenced in FIG. 1 describes an electrical architecture where the conductive path of a closed switch is through the length of the movable element, but it is recognized that other switch architectures can exist where the movable MEMS switch element shunts two separate, planar and isolated conductive paths. As such, references throughout to "a MEMS switch" (e.g., MEMS switch 24) should be understood to refer to either a single switch or a switch array.

Referring back now to FIG. 1, and with continued reference to FIGS. 2-4, according to embodiments of the invention, the auxiliary circuit 14 and control circuit 16 are provided in the MEMS relay circuit 10 in order to provide for operation of the MEMS switch 24 at acceptable voltage and energy levels that increase switching efficiency and switch protection/longevity. That is, the auxiliary circuit 14 (via controlling thereof by control circuit 16) functions to prevent the MEMS switch 24 from operating in a "hot switching" condition that could negatively impact the switching efficiency and switch longevity. It is recognized that the voltage and energy levels present across the MEMS switch 24 during switching thereof that are deemed to be acceptable can vary based on the function performed by the switch and the number of cycles/switching operations which the switch is desired to be able to withstand (i.e., an expected switch longevity. For example, for a MEMS switch 24 implemented as part of a circuit breaker, where a lifespan of 10,000-100,000 switch cycles/operations is sufficient, the voltage and energy levels across the switch that are deemed to be acceptable is higher than a switch whose longevity is expected to be a billion or more cycles. Thus, for a MEMS switch 24 implemented as part of a circuit breaker, the auxiliary circuit 14 functions to control voltage and energy levels across the MEMS switch 24 to approximately 10 V and 5 microjoules, respectively, while for a MEMS switch 24 with a greater expected lifespan, the auxiliary circuit 14 functions to control voltage and energy levels across the MEMS switch 24 to approximately 1 V and 50 nanojoules, respectively.

In operation of the MEMS relay circuit 10, the control circuit 16 receives an On-Off control signal from control terminals 40, 42 connected thereto, with the On-Off control signal indicating a desired operating condition of the MEMS relay circuit 10. Responsive to the On-Off control signal, the control circuit 16 transmits a control signal to the driver circuit 38 that causes the driver circuit 38 to selectively provide a voltage (via gate voltage source 36) to the electrode 34 of the MEMS switch 24—so as to thereby position the MEMS switch 24 in either the open or closed position.

If the control circuit 16 receives an On signal from control terminals 40, 42, then a control signal is transmitted to the driver circuit 38 that causes a high gate voltage to be applied to the electrode 34, thereby causing the MEMS switch 24 to be in the closed position so as to allow current to flow therethrough. If the control circuit 16 receives an Off signal from control terminals 40, 42, then a control signal is transmitted to the driver circuit 38 that causes a low gate voltage (or zero voltage) to be applied to the electrode 34, thereby causing the MEMS switch 24 to be in the open position so as to disconnect the power circuit 18.

In addition to providing control signals to the driver circuit 38 of the MEMS switching circuit 12, the control circuit 16 also sends control signals to the auxiliary circuit 14 responsive to the received On-Off control signal. The control signals provided to the auxiliary circuit 14 act to selectively activate and deactivate the auxiliary circuit 14. More specifically, the control circuit 16 is programmed to send control signals to the auxiliary circuit 14 that cause the auxiliary circuit 14 to be activated during the switching interval of the MEMS switch 24 when moving between the open and closed positions and that cause the auxiliary circuit 14 to be deactivated when the MEMS switch 24 is stationary at the fully open or closed position. Activation of the auxiliary circuit 14 during the switching interval of the MEMS switch 24 when moving between the open and closed positions causes at least a portion of the load current $I_{LOAD}$ to flow toward the auxiliary circuit 14, which in turn reduces the voltage and energy across the MEMS switch 24 during the switching interval. The voltage across the MEMS switch 24 can be limited by activation of the auxiliary circuit 14 such that the voltage does not exceed a pre-determined voltage threshold. In an exemplary embodiment, and as indicated previously, the pre-determined voltage threshold may be a threshold associated with a "hot switching" condition, with the auxiliary circuit 14 functioning to prevent a voltage and energy level across the MEMS switch 24 during the switching interval from exceeding approximately 1 V and 50 nanojoules or from exceeding approximately 10 V and 5 microjoules, depending on the switch function and implementation. By limiting the voltage across the MEMS switch 24 to a low voltage level, reliable operation of MEMS switch can be assured.

In an exemplary embodiment, a sequence by which the MEMS switch 24 is moved between the open and closed positions and by which the activation/deactivation of the auxiliary circuit 14 is performed is controlled by the control circuit 16 to provide adequate protection to the MEMS switch 24. When an On-Off control signal is received by the control circuit 16 (indicating that the MEMS switch 24 is to be moved from the open to the closed position or from the closed to the open position), the control circuit 16 first causes the auxiliary circuit 14 to be activated such that at least a portion of the load current is diverted from the MEMS switch 24 to the auxiliary circuit 14. Upon activation of the auxiliary circuit 14, the control circuit 16 then causes the driver circuit 38 to provide a controlled voltage to the MEMS switch 24 so as to initiate actuation of the MEMS switch 24 from the open to the closed position or from the closed to the open position—with voltage across the MEMS switch 24 being clamped during the switching movement based on the activation of the auxiliary circuit 14. After the MEMS switch 24 has moved fully to the open position or the closed position—which may be detected based on feedback provided to the control circuit 16 regarding the operating conditions of the MEMS switch 24—the control circuit 16 then causes the auxiliary circuit 14 to be deactivated, such that the full load current is either passed through the closed MEMS switch 24 or the full load voltage is sustained across the open switch contacts 24.

Figure 5:
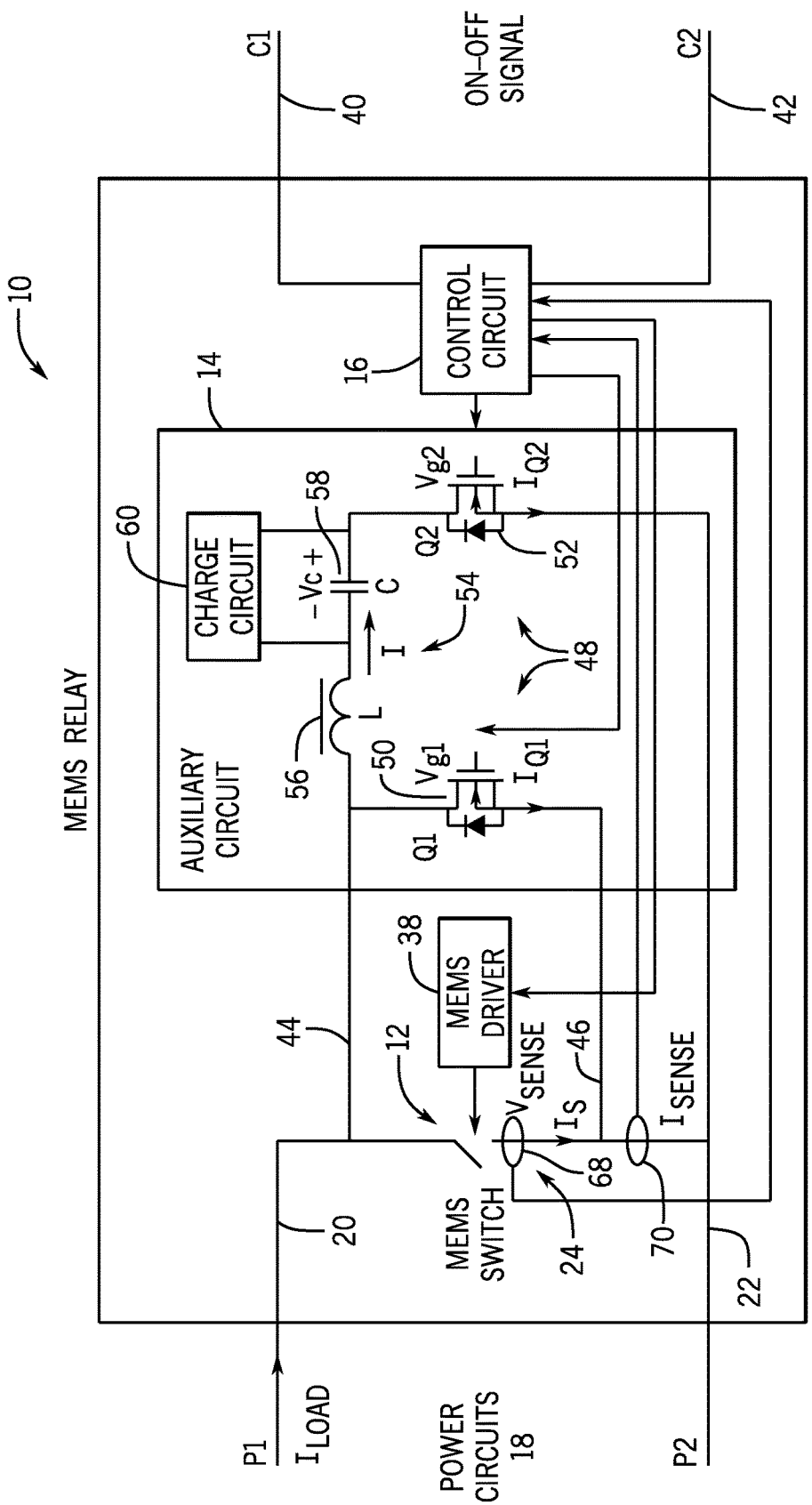
FIG. 5 is a schematic view of an auxiliary circuit useable in the MEMS relay circuit of FIG. 1 in accordance with an exemplary embodiment.

Referring now to FIG. 5, a detailed view of an auxiliary circuit 14 useable in the MEMS relay circuit 10 of FIG. 1, and its connection to MEMS switching circuit 12 and control circuit 16 is shown according to an exemplary embodiment. As shown in FIG. 5, the auxiliary circuit 14 is connected in parallel with the MEMS switch 24—with a first connection 44 of the auxiliary circuit 14 connected to the MEMS switch 24 on a side thereof connected to power terminal 20 and with a second connection 46 of the auxiliary circuit 14 connected to the MEMS switch 24 on a side thereof connected to power terminal 22. The auxiliary circuit 14 includes solid state switching circuitry 48 that, in the illustrated embodiment, is composed of a pair of MOSFETs 50, 52 (also referred to as MOSFETs Q1 and Q2, respectively) arranged in parallel, although it is recognized that other suitable solid state switches could be substituted for the MOSFETs. The auxiliary circuit 14 further includes a resonant circuit 54 (consisting of an inductor 56 and capacitor 58 arranged in series) positioned between the MOSFETs 50, 52, as well as a charge circuit 60 for charging the capacitor 58 of the resonant circuit 54.

The construction of auxiliary circuit 13 allows it to function in two separate operating modes—low current mode and high current mode—with the selection of the low current or high current mode dependent on the magnitude of the load current $I_{LOAD}$ provided to the MEMS relay circuit 10 from power circuit 18. In the low current mode of operation, MOSFET 50 is turned On so as to conduct current therethrough while MOSFET 52 remains in an Off condition such that it is non-conductive. Along with MOSFET 52 being Off, the resonant circuit 54 also is not activated when the auxiliary circuit 14 is in the low current mode. In the high current mode of operation, both of MOSFETs 50 and 52 are turned On so as to conduct current therethrough, and the resonant circuit 54 is activated to draw current from MOSFET 50 and provide resonance. It is noted that when the inductor 56 and capacitor 58 of the resonant circuit 54 operate in a resonant mode, the voltage across them is the conduction voltage of MOSFET 52 and MOSFET 50, which is very small. Therefore, the peak resonant current can be very high with moderate inductance and capacitance values and with a pre-charged capacitor voltage (charged by charge circuit 60). By resonance, the pre-charged capacitor voltage will be recovered to a large extent.

Figure 6:
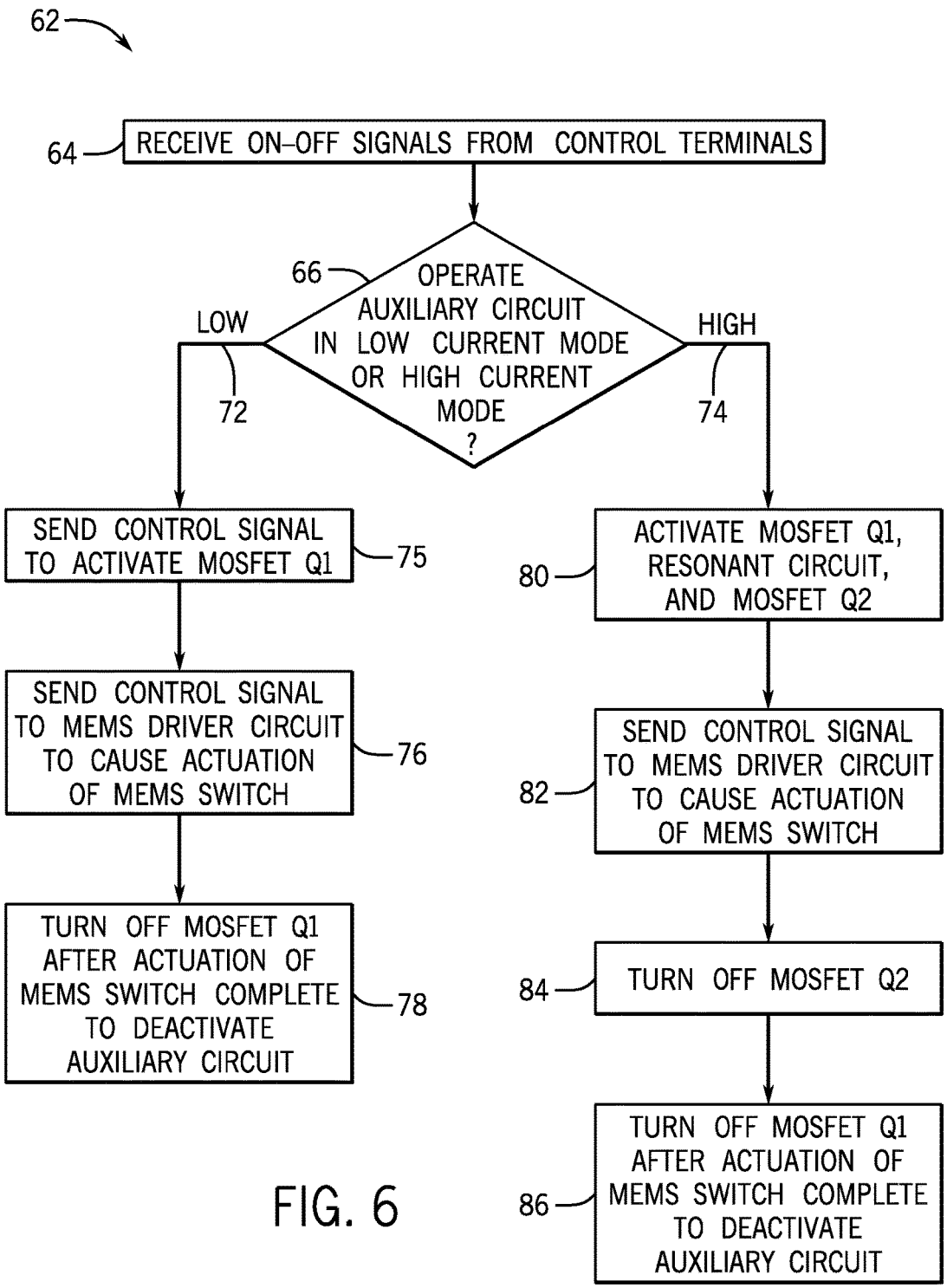
FIG. 6 is a flowchart illustrating a technique for operating the auxiliary circuit of FIG. 5 in a low current mode and high current mode of operation in accordance with an exemplary embodiment

A technique implemented by control circuit 16 for operating the auxiliary circuit 14 in the low current mode and high current mode relative to operation of the MEMS switching circuit is shown and described in greater detail in FIG. 6. Initially in technique 62, an On-Off signal is received by the control circuit at STEP 64 indicating a desired/required movement of the MEMS switch 24 from the open position to the closed position or from the closed position to the open position. Upon receipt of the On-Off signal by control circuit 16, a determination is made by control circuit 16 at STEP 66 as to whether the auxiliary circuit 14 is to be operated in the low current mode or the high current mode of operation. In order to make this determination, the control circuit 16 receives feedback from one or more sensing devices that may include a voltage sensor 68 and/or a current sensing circuit 70, $I_{sense}$, (see FIG. 5) that is/are positioned so as to sense a voltage across the MEMS switch 24 (when in the open position) or a current flowing through the MEMS switch 24 (when in the closed position).

When the MEMS switch 24 is in the fully open position (and is to be transitioned to the closed position), the voltage sensor 68 (e.g., comparator) will sense a voltage across MEMS switch 24. When the MEMS switch 24 is in the fully open position (and is to be transitioned to the closed position), the voltage sensor 68 will sense a voltage across MEMS switch 24—from which a current may then be calculated The level of voltage sensed by voltage sensor 68 is analyzed by the control circuit 16 in order to determine what the associated current through the switch would be when in the closed position—with a determination then also being made of which auxiliary circuit mode of operation should be employed. That is, if the voltage sensed by the voltage sensor 68 is of a level that when a full load current is passed through MOSFET Q1, an associated voltage drop, $V_{ds1}$, of MOSFET Q1 is sufficiently low so that the voltage across MEMS switch 24 is also sufficiently low, then the control circuit 16 determines that the auxiliary circuit 14 should be operated in the low current mode of operation, as indicated at STEP 72. Conversely, if the voltage sensed by the current voltage sensor 68 is of a level that when a full load current is passed through MOSFET Q1, an associated voltage drop, $V_{ds1}$, of MOSFET Q1 may be too high for reliable operation of the MEMS switch 24 (i.e., the voltage across the MEMS switch 24 may be too high—such as above the hot switching threshold), then the control circuit 16 determines that the auxiliary circuit 14 should be operated in the high current mode of operation. In an alternative embodiment, it is recognized that when the MEMS switch 24 is in the fully open position (and is to be transitioned to the closed position)—rather than sensing a voltage across MEMS switch 24 via voltage sensor 68—the control circuit 16 could instead simply default to operating the auxiliary circuit 14 in the high current mode.

When the MEMS switch 24 is in the fully closed position (and is to be transitioned to the open position), the current sensing circuit 70 will sense the current flowing through the MEMS switch 24. The level of current sensed by current sensing circuit 70 is analyzed by the control circuit 16 in order to determine which auxiliary circuit mode of operation should be employed. That is, if the current sensed by the current sensing circuit 70 is of a level that when a full load current is passed through MOSFET Q1, an associated voltage drop, $V_{ds1}$, of MOSFET Q1 is sufficiently low so that the voltage across MEMS switch 24 is also sufficiently low, then the control circuit 16 determines that the auxiliary circuit 14 should be operated in the low current mode of operation, as indicated at STEP 72. Conversely, if the current sensed by the current sensing circuit 70 is of a level that when a full load current is passed through MOSFET Q1, an associated voltage drop, $V_{ds1}$, of MOSFET Q1 may be too high for reliable operation of the MEMS switch 24 (i.e., the voltage across the MEMS switch 24 may be too high—such as above the hot switching threshold), then the control circuit 16 determines that the auxiliary circuit 14 should be operated in the high current mode of operation.

When the control circuit 16 determines at STEP 66 that the auxiliary circuit 14 may be operated in the low current mode of operation (based on feedback from the voltage sensor 68 or current sensing circuit 70), as indicated at 72, the control circuit 16 will send control signals to the auxiliary circuit 14 at STEP 75 to cause activation of MOSFET Q1, with activation of MOSFET Q1 allowing current to conduct therethrough. After activation of the MOSFET Q1, the control circuit 16 sends a control signal to the driver circuit 38 at STEP 76 that provides for actuation of the MEMS switch 24. When the MEMS switch 24 is to be turned/actuated from Off to On, MOSFET Q1 is first turned on such that the load current will flow through MOSFET Q1 (STEP 75) and the voltage across MEMS switch 24 becomes $V_{ds1}$, which is the voltage across MOSFET Q1. After MOSFET Q1 has been activated, the MEMS switch 24 is then turned On/closed at STEP 76—with the voltage across the MEMS switch 24 being controlled below a desired threshold based on the activation of MOSFET Q1. The MOSFET Q1 remains activated until the MEMS switch 24 has completely closed, at which time MOSFET Q1 is turned off at STEP 78, such that the auxiliary circuit 14 is deactivated. When the MEMS switch 24 is to be turned/actuated from On to Off, MOSFET Q1 is first turned on—with the result being that a small portion of the load current $I_{LOAD}$ will be diverted to the MOSFET Q1 while a majority of the load current still flows through the MEMS switch 24, as it has a lower On resistance. After the MOSFET Q1 has been fully activated, the MEMS switch 24 is moved to the Off/open position at STEP 76, with the voltage across the MEMS switch 24 being limited by the On voltage of MOSFET Q1, $V_{ds1}$. Upon movement of the MEMS switch 24 to the fully open position, an entirety of the load current flows through MOSFET Q1, and the MOSFET Q1 is then turned off at STEP 78 (i.e., the auxiliary circuit 14 is deactivated) and the load current $I_{LOAD}$ is disconnected with the MEMS relay circuit 10 in the Off state.

When the control circuit 16 determines at STEP 66 that the auxiliary circuit 14 should be operated in the high current mode of operation (based on feedback from the current sensing circuit), as indicated at 74, the control circuit 16 will send control signals to the auxiliary circuit 14 at STEP 80 to cause activation of MOSFET Q1 and activation of the resonant circuit 54 and MOSFET Q2 to reduce the current through MOSFET Q1 and MEMS switch 24. That is, when the MOSFET Q1 is fully on, the resonant circuit 54 and MOSFET Q2 are then turned on—with the resonant circuit 54 causing resonant current to flow in the direction towards MOSFET Q2 (via pre-charging of the capacitor 58 in the direction toward MOSFET Q2, as shown) so as to reduce the current through MOSFET Q1. After activation of the resonant circuit 54 and MOSFET Q2, the control circuit 16 then sends a control signal to the driver circuit 38 at STEP 82 that provides for actuation of the MEMS switch 24, with it being recognized that the reduction of current through MOSFET Q1 to an acceptably low level results in an acceptable voltage $V_{ds1}$ across the MOSFET Q1 and a corresponding acceptable voltage level across the MEMS switch 24 that is below a pre-determined threshold during actuation thereof.

In high current mode operation of the auxiliary circuit 14, when the MEMS switch 24 is to be turned/actuated from Off to On, after activation of the MOSFET Q1 has been performed and the load current $I_{LOAD}$ is flowing therethrough, MOSFET Q2 is then turned on—with the resonant circuit 54 causing resonant current to flow in the direction towards MOSFET Q2 to reduce the current through MOSFET Q1. Upon activation of MOSFET Q2, the resonant current will reduce the current through MOSFET Q1 and therefore reduce the voltage $V_{ds1}$ across MOSFET Q1 to a sufficiently low level, with the MEMS switch 24 then being turned On/closed (STEP 82)—with the voltage across the MEMS switch 24 being controlled below a desired threshold based on the activation of MOSFETs Q1 and Q2. The MOSFETs Q1 and Q2 remain activated until the MEMS switch 24 has completely closed, at which time MOSFET Q2 is then turned off at STEP 84 (after $I_{Q2}$ reverses direction)—with the resonance stopping after the inductor current becomes zero, i.e., after one resonant period. Upon termination of the resonance, MOSFET Q1 is then turned Off at STEP 86, such that the auxiliary circuit 14 is fully deactivated.

In high current mode operation of the auxiliary circuit 14, when the MEMS switch 24 is to be turned/actuated from On to Off, after activation of the MOSFET Q1 has been performed and the load current $I_{LOAD}$ is flowing therethrough, MOSFET Q2 is then turned on—with the resonant circuit 54 causing resonant current to flow in the direction towards MOSFET Q2 to reduce the combined current flowing through the MEMS switch 24 and MOSFET Q1. Upon reduction of the combined current flowing through the MEMS switch 24 and MOSFET Q1 and an accompanying reduction of the voltage level across the MEMS switch 24 and MOSFET Q1 to a sufficiently low level, the MEMS switch 24 is then turned Off/opened at a low voltage (STEP 82). The MOSFETs Q1 and Q2 remain activated until the MEMS switch 24 has completely opened, at which time MOSFET Q2 is then turned off at STEP 84 (after $I_{Q2}$ reverses direction)—with the resonance stopping after the inductor current becomes zero, i.e., after one resonant period. Upon termination of the resonance, MOSFET Q1 is then turned Off at STEP 86, such that the auxiliary circuit 14 is fully deactivated and the load current is disconnected with the MEMS relay circuit 10 in the Off state.

Figure 7:
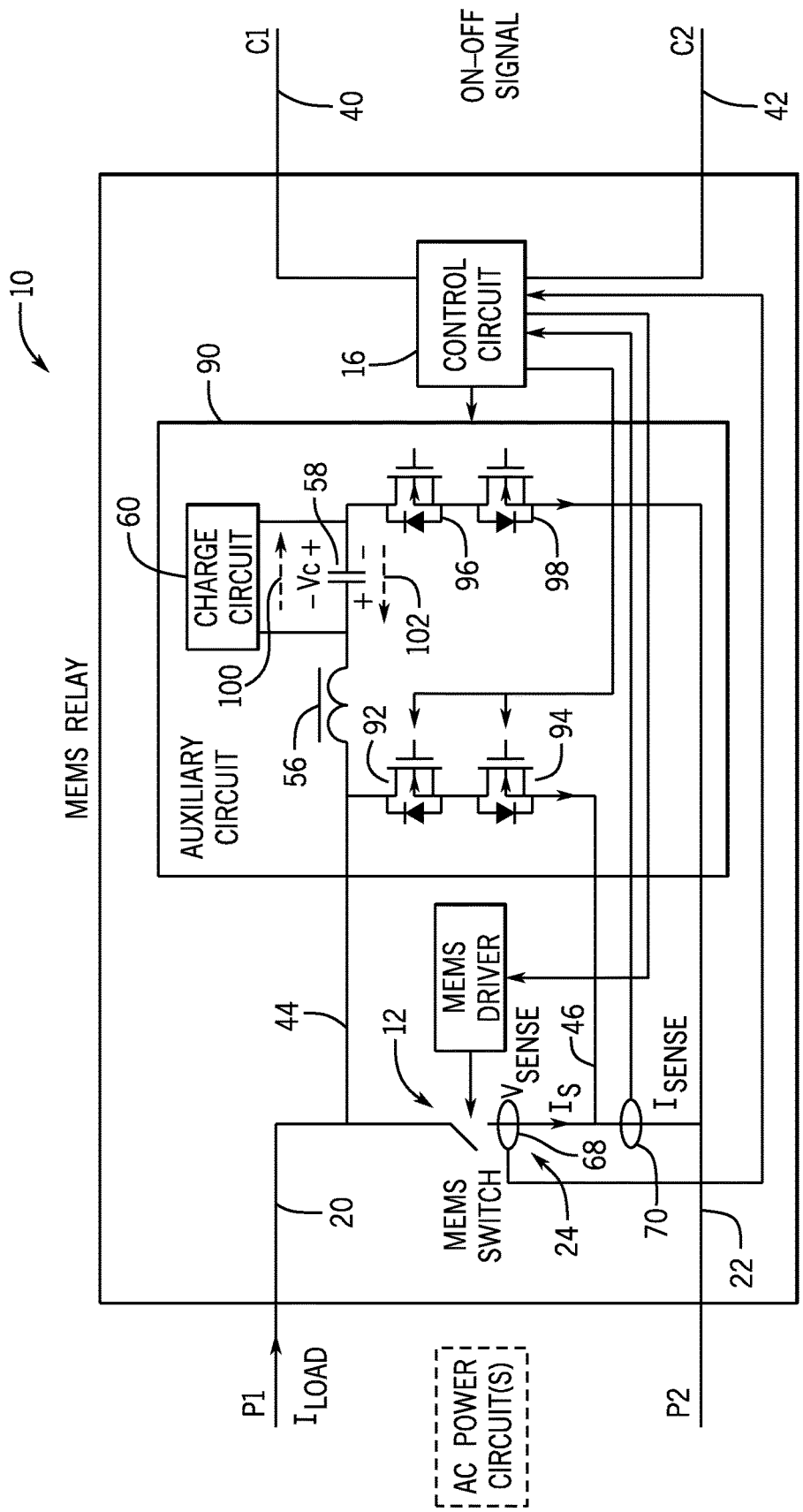
FIG. 7 is a schematic view of an auxiliary circuit useable in the MEMS relay circuit of FIG. 1 in accordance with an exemplary embodiment.

The auxiliary circuit 14 shown and described in FIG. 5 is employed with a power circuit 18 connected to MEMS relay circuit 10 that applies a DC power at the power terminals 20, 22, and it is recognized that the structure of the auxiliary circuit 14 would be modified when a power circuit is connected to MEMS relay circuit 10 that applies an AC power at the power terminals 20, 22. Referring now to FIG. 7, an auxiliary circuit 90 for use with a power circuit that provides AC power to the MEMS relay circuit 10 is illustrated according to another embodiment. The auxiliary circuit 90 of FIG. 7 differs from the auxiliary circuit 14 of FIG. 5 in that each of the MOSFETs 50 and 52 is replaced by a pair of MOSFETS connected back-to-back—i.e., MOSFETS 92, 94 and 96, 98. In an AC application, the precharged capacitor voltage polarity (of capacitor 58) would be changed at line cycle based on the actual load current $I_{LOAD}$. For example, when the actual load current is from power terminal 20 to power terminal 22, the capacitor voltage polarity would be in a first direction, as indicated at 100 in FIG. 7. In this way, the resonant current would reduce the actual MEMS switch current. When the actual load current flows from power terminal 22 to power terminal 20, the capacitor voltage polarity would be reversed so as to be in a second direction, as indicated at 102 in FIG. 7—such that the resonant current would again reduce the actual MEMS switch current. In the auxiliary circuit 90, the power loss would be very small, as the capacitor value is small, capacitor voltage is also small, and the frequency is low.

Figure 8:
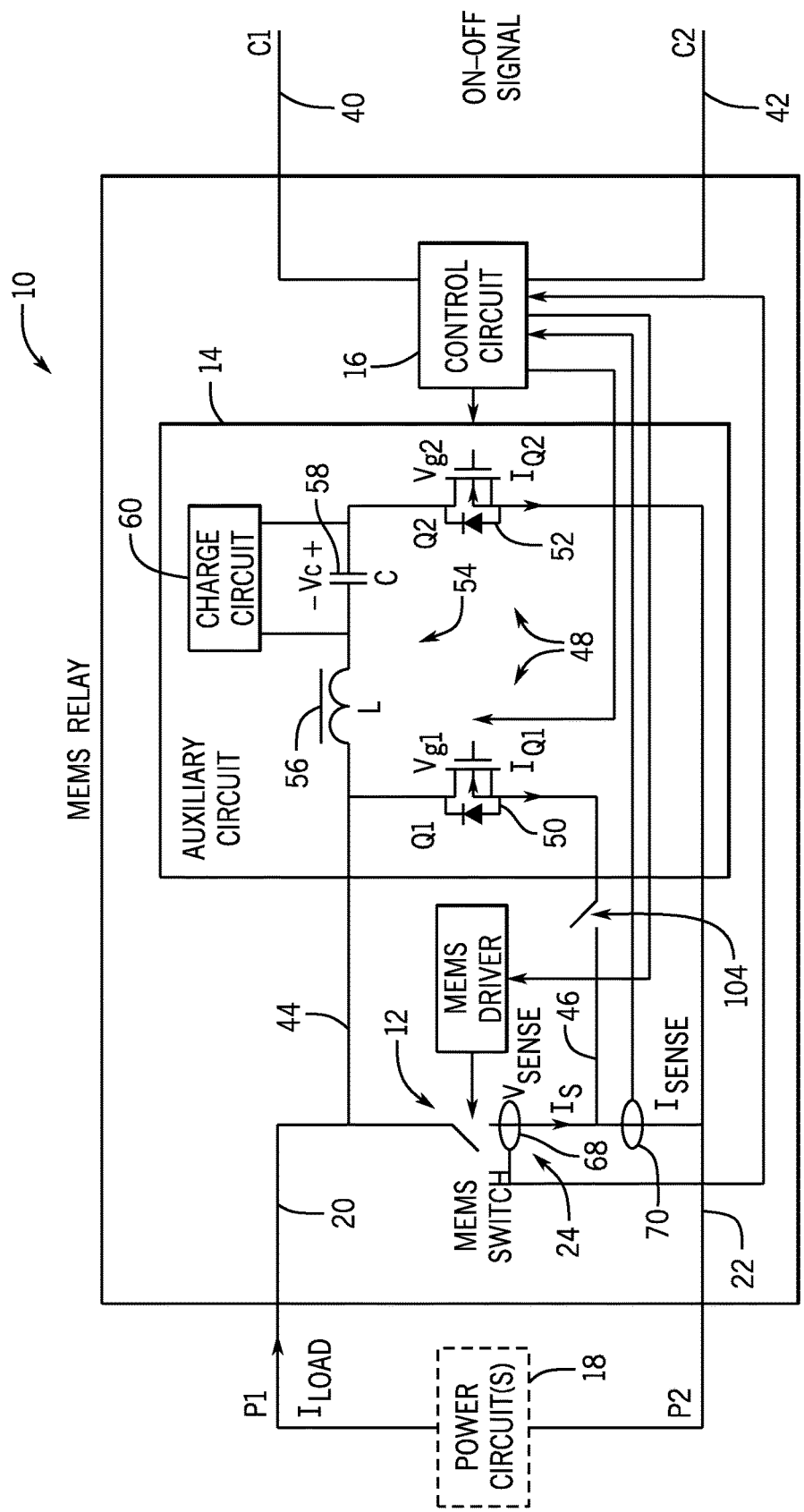
FIG. 8 is a schematic view of an auxiliary circuit useable in the MEMS relay circuit of FIG. 1 in accordance with an exemplary embodiment.

Referring now to FIG. 8, in still another embodiment, the structure of an MEMS relay circuit 10 incorporating the auxiliary circuit 14 shown and described in FIG. 5 is modified to provide for electrical isolation of the auxiliary circuit from the power circuit. To provide such isolation, a MEMS switch 104 would be positioned in series with the auxiliary circuit 14 to selectively connect and disconnect the auxiliary circuit 14 from the power circuit 18. In an exemplary embodiment, the MEMS switch 104 would be positioned in series with MOSFET 50—between MOSFET 50 and the second connection 46 of the auxiliary circuit 14—to open up leakage of the auxiliary circuit 14.

The auxiliary circuits 14, 90 illustrated in FIGS. 5, 7 and 8 beneficially provide a low cost and small option for controlling voltage across the MEMS switching circuit 12. The auxiliary circuit 14 requires only two MOSFETs 50, 52, one inductor 56 and one capacitor 58. The operation of the auxiliary circuit 14 in one of two operating modes—low current mode or high current mode—allows for flexibility with regard to the On resistance of the MOSFET 50 (i.e., the on resistance does not need to be very small), such that the cost of the MOSFET 50 can be low, and there is no specific requirement for the On resistance of MOSFET 52. In addition, when the inductor 56 and capacitor 58 operate in resonant mode, the voltage across them is the conduction voltage of MOSFETs 52 and 50, which is very small, such that the peak resonant current can be very high with moderate inductor and capacitor values and the pre-charge capacitor voltage.

Figure 9:
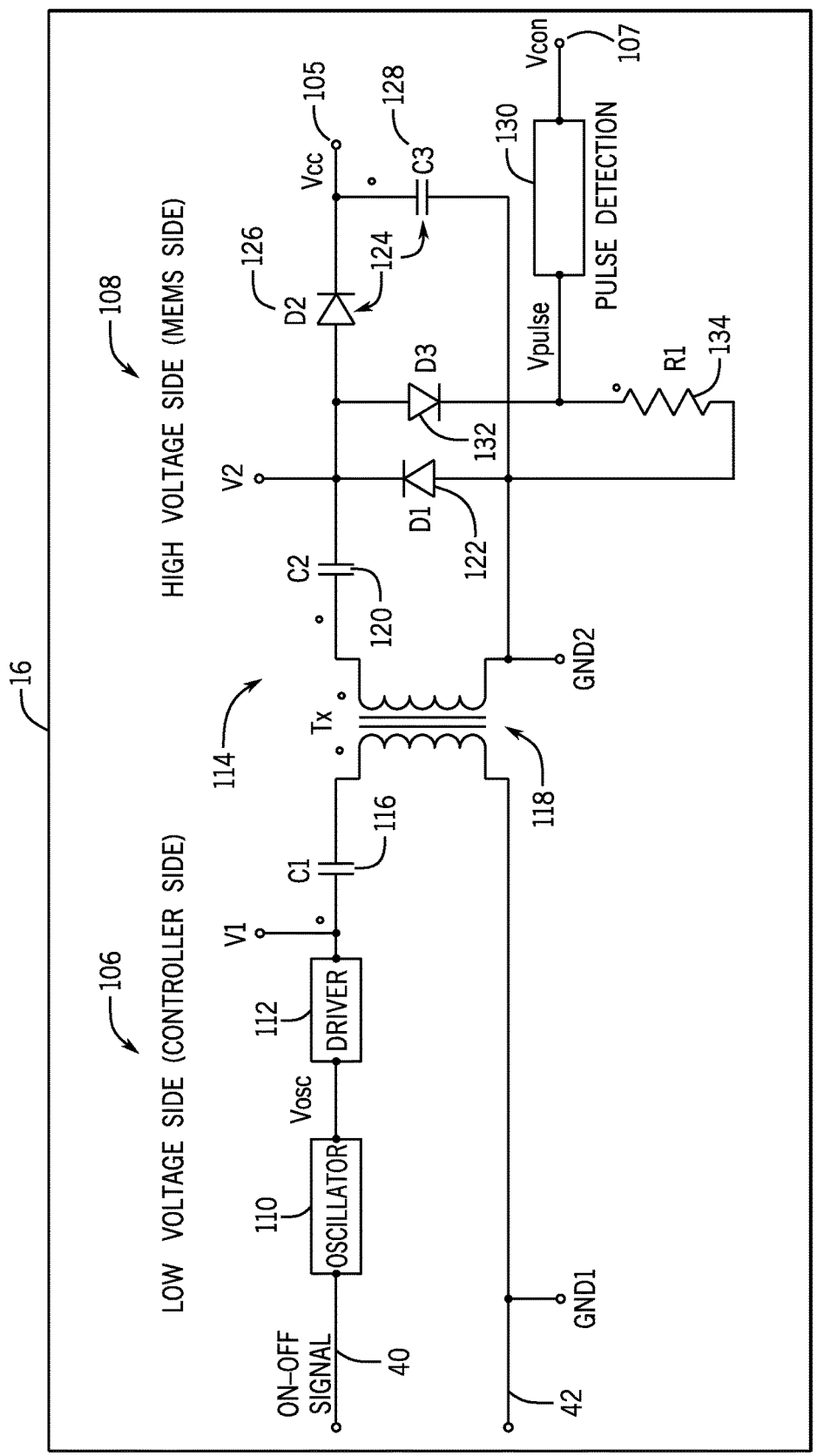
FIG. 9 is a schematic view of a control circuit useable in the MEMS relay circuit of FIG. 1 in accordance with an exemplary embodiment.

Referring now to FIG. 9, and with reference back to FIGS. 1 and 5, a detailed view of a control circuit 16 useable in the MEMS relay circuit 10 of FIG. 1, and its connection to MEMS switching circuit 12 and auxiliary circuit 14, is shown according to an exemplary embodiment. The control circuit 16 is configured so as to provide for electrical isolation between control input terminals 40, 42 and control output terminals 105, 107 thereof (i.e., from a low voltage "control side" 106 to a high voltage "power side" 108) and provide the logic circuitry necessary to control a transfer of switching signals power for the MEMS switching circuit 12 and auxiliary circuit 14. The control circuit 16 provides for transferring of the On-Off control signal (received via control terminals 40, 42) and power from the control side 106 of the MEMS relay circuit 10 to the MEMS switching circuit 12 on the power side 108 of the MEMS relay circuit 10, with the On-Off control signal and power being transferred across an isolation barrier.

As shown in FIG. 9, the control circuit 16 includes an oscillator 110 that is connected to control terminal 40 and is controlled by the On-Off signals received thereby, with the On-Off signals being logic high-logic low signals. The logic level On-Off signals cause the oscillator 110 to generate an electrical pulse (i.e., a "first electrical pulse") having a voltage, $V_{osc}$, and a "first signal characteristic" when the On-Off signal is logic high and a "second signal characteristic" when the On-Off signal is logic low. In one embodiment, the logic level On-Off signals cause the oscillator 110 to generate an electrical pulse at a first frequency $F_1$ when the On-Off signal is logic high and at a second frequency $F_2$ when the On-Off signal is logic low. In another embodiment, the logic level On-Off signals cause the oscillator to operate in a PWM (pulse width modulated) mode where the oscillator's duty cycle would vary (i.e., the pulse width would vary) but its frequency would be constant. That is, when the On-Off signal is a logic high, the oscillator 110 would output an electrical pulse at a first duty cycle, $DC_1$, (for example 50% duty cycle), and when the On-Off signal is a logic low, the oscillator 110 would output an electrical pulse at a second duty cycle, $DC_2$, (for example 10% duty cycle). In practice, the PWM mode is preferred since it allows a pulse transformer in the control circuit 16 (as described in further detail below) to be designed for operation at a single frequency, thus simplifying the design. A driver 112 is connected to the oscillator 110 that acts as a low voltage buffer in control circuit 16 and also increases the current driving/carrying capability (i.e., provides a current boost) of the oscillator 110.

As further shown in FIG. 9, the control circuit 16 includes a pulse transformer 114 that serves to interface the low-voltage control side 106 to the high-voltage power side 108 (i.e., to gates of the MEMS switch 24 and MOSFETs 50, 52 (in auxiliary circuit 14)—and provides an electrical isolation barrier across which control signals and power is transmitted, such as in the form of rectangular electrical pulses (that is, pulses with fast rise and fall times and a relatively constant amplitude). A primary side of the pulse transformer 114 is provided on the low voltage side 106 of the control circuit 16, while a secondary side of the pulse transformer 114 is provided on the high voltage side 108 of the control circuit 16. In an exemplary embodiment, the pulse transformer 114 may be constructed to have two windings thereon in order to provide an appropriate level of voltage increase thereacross—such as a conversion from 0-5 V at the control terminal up to 10 V (to drive MOSFETs 50, 52 in auxiliary circuit) and/or 60-80 V (to drive MEMS switch 24)—although it is recognized that other numbers of windings could be provided on the transformer. In operation, the pulse transformer 114 receives the first electrical pulse from the oscillator 110 and outputs a "second electrical pulse" having the same signal characteristic as the first electrical pulse provided from the oscillator 110 (i.e., at either the same first frequency or second frequency, or at either the same first duty cycle or second duty cycle), but that is electrically isolated from the first electrical pulse.

Also included in control circuit 16 are a capacitor 116 on the primary side, a capacitor 120 on the secondary side, and a diode 122 on the secondary side. The pulse transformer 114 operates with the arrangement of the capacitor 116, capacitor 120, and diode 122 to provide for DC voltage recovery, such that a voltage on the control side, $V_1$, and a voltage on the power side, $V_2$, have the same shape (i.e., same frequency and/or duty cycle)—with the voltages $V_1$ and $V_2$ being electrically isolated and referenced to different grounds.

Also included in control circuit 16 is a peak voltage detector 124 comprised of a diode 126 and capacitor 128. The peak voltage detector 124 functions to detect the peak voltage of voltage $V_2$ and can be used as a power source for all the electronic circuits on the high voltage side 108 of the MEMS relay circuit 10 (MEMS switch side), including the MEMS driver circuit 38, pulse detection circuits 130, and other control and driver circuits for the auxiliary circuit 14—with an output of the peak voltage detector 124, $V_{cc}$, being provided to output terminal 105.

In an exemplary embodiment, an additional diode 132 and resistor 134 in control circuit 16 retrieve the second electrical pulse generated by pulse transformer 114, the voltage of which is referred to as $V_{pulse}$ in FIG. 9. After passing through diode 132 and resistor 134, the second electrical pulse is then provided to a pulse detection circuit 130. According to embodiments of the invention, the pulse detection circuit 130 may be configured to determine/detect the frequency of the pulse signal—i.e., whether the second electrical pulse is at the first frequency $F_1$ or the second frequency $F_2$—or determine/detect the duty cycle (by detecting the pulse width) of the pulse signal—i.e., whether the second electrical pulse is at the first duty cycle $DC_1$ or the duty cycle $DC_2$. The pulse detection circuit 130 then subsequently controls transmission of power and control signals to the MEMS switching circuit 12 based on this determination. While control circuit 16 is illustrated as including diode 132 and resistor 134 to retrieve the electrical pulse signal, an alternative version of control circuit 16 could omit these components—as it is possible to connect the voltage $V_2$ directly into the pulse detection circuit 130.

In operation, and when configured to determine frequency of the second electrical pulse, the pulse detection circuit 130 detects the frequency of the second electrical pulse output from pulse transformer 114 (which is same as that of $V_1$). When the pulse detection circuit detects that the frequency of $V_{pulse}$ is a first frequency, $F_1$, the voltage of a generated control signal, $V_{con}$, provided to driver circuit 38 (to control the switching of MEMS switch 24) will be logic high to indicate that the On-Off signal is high—therefore causing the MEMS switch to actuate to the closed position. When the pulse detection circuit 130 detects that the frequency of the second electrical pulse is a second frequency, $F_2$, the voltage of the generated control signal, $V_{con}$, provided to driver circuit 38 (to control the switching of MEMS switch 24) will be logic low to indicate that the On-Off signal is low—therefore causing the MEMS switch to actuate to the open position.

In operation, and when configured to determine the duty cycle of the second electrical pulse, the pulse detection circuit 130 detects the duty cycle of the second electrical pulse output from pulse transformer 114 (which is same as that of $V_1$). When the pulse detection circuit detects that the duty cycle of $V_{pulse}$ is a first duty cycle, $DC_1$, the voltage of a generated control signal, $V_{con}$, provided to driver circuit 38 (to control the switching of MEMS switch 24) will be logic high to indicate that the On-Off signal is high—therefore causing the MEMS switch to actuate to the closed position. When the pulse detection circuit 130 detects that the duty cycle of the second electrical pulse is a second duty cycle, $DC_2$, the voltage of the generated control signal, $V_{con}$, provided to driver circuit 38 (to control the switching of MEMS switch 24) will be logic low to indicate that the On-Off signal is low—therefore causing the MEMS switch to actuate to the open position.

The control circuit 16 of FIG. 9 beneficially provides immediate on-off signal detection and is cost effective compared to an optocoupler solution. The control circuit provides for the transfer of power and the transmission of control signals using only one pulse transformer and low cost electronic circuits, and as the control circuit 16 is capable of transferring power across the transformer, it eliminates the need for a separate isolated secondary-side power supply. Pulse transformers are widely available with high voltage insulation level, such that the control circuit exhibits low power dissipation at reduced cost. In the particular case of a MEMS switch requiring a high voltage drive, the transformer solution is even more attractive since it allows the voltage to be stepped up.

A technical contribution of embodiments of the invention is that it provides a controller implemented technique for providing appropriate power and control signals to a MEMS switching circuit and auxiliary circuit of a MEMS relay circuit. A control circuit of the MEMS relay circuit receives an On or Off signal indicative of a desired operating condition of the MEMS relay circuit, generates an electrical signal at a specified frequency responsive to the received On or Off signal, and outputs a logic high or logic low signal based on the specified frequency, with the logic high or logic low signal selectively causing a voltage to be applied a MEMS switch of the MEMS switching circuit so as to actuate the MEMS switch between a contacting position or non-contacting position.

Therefore, according to one embodiment of the invention, a switching system includes a switch connectable to a power circuit to receive a load current therefrom. The switching system also includes a control circuit operably connected to the switch to control selective switching of the switch, the control circuit including control input terminals to receive an On-Off signal indicative of a desired operating state of the switch, control output terminals that transmit power and control signals to the switch responsive to the received On-Off signal, and an oscillator coupled to the control input terminals and configured to generate a first electrical pulse responsive to the received On-Off signal, the first electrical pulse having one of a first signal characteristic and a second signal characteristic that is determined by the On-Off signal. The control circuit also includes a pulse transformer connected to receive the first electrical pulse from the oscillator and output a second electrical pulse electrically isolated from the first electrical pulse, the second electrical pulse having the same one of the first signal characteristic and the second signal characteristic as the first electrical pulse. The control circuit further includes a pulse detection circuit configured to receive the second electrical pulse, determine whether the second electrical pulse has the first signal characteristic or the second signal characteristic, and control transmission of power and control signals to the switch based on the determination of the second electrical pulse having the first signal characteristic or the second signal characteristic. The first signal characteristic comprises one of a first frequency and a first duty cycle and the second signal characteristic comprises one of a second frequency and a second duty.

According to another embodiment of the invention, a MEMS relay circuit includes a MEMS switching circuit having a MEMS switch moveable between an open position and a closed position to selectively pass a load current therethrough and a MEMS driver circuit configured to provide a drive signal to cause the MEMS switch to move between the open and closed positions. The MEMS relay circuit also includes a control circuit operably connected to the MEMS switching circuit to control switching of the MEMS switch, the control circuit including a pulse transformer configured to isolate a control side of the control circuit from a power side of the control circuit and an oscillator positioned on the control side and configured to generate a first electrical pulse responsive to a received On-Off signal, the first electrical pulse having one of a specified frequency and a specified duty cycle based on the On-Off signal, the specified frequency comprising one of a first frequency and a second frequency and the specified duty cycle comprising one of a first duty cycle and a second duty cycle. The control circuit also includes power and logic circuitry positioned on the power side that is configured to condition an output of the pulse transformer to provide a second electrical pulse having the same one of the specified frequency or specified duty cycle as the first electrical pulse, determine whether the second electrical pulse is at the one of the specified first or second frequency or the specified first or second duty cycle, and transmit one of a logic high signal and a logic low signal to the MEMS switching circuit based on the determination of the second electrical pulse having the specified first or second frequency or the specified first or second duty cycle.

According to yet another embodiment of the invention, a method of controlling a micro-electromechanical system (MEMS) relay circuit that includes a MEMS switching circuit, an auxiliary circuit and a control circuit is provided. The method includes receiving at the control circuit one of an Off signal and an On signal comprising a desired operating condition of the MEMS relay circuit and causing an oscillator in the control circuit to generate a first electrical signal responsive to the one of the Off signal and the On signal, the first electrical signal having a first signal characteristic when an On signal is received and having a second signal characteristic when an Off signal is received. The method also includes routing the first electrical signal through a pulse transformer to generate a second electrical signal that is electrically isolated from the first electrical signal, the second electrical signal having the same one of the first signal characteristic or the second signal characteristic as the first electrical signal. The method further includes determining via a pulse detection circuit whether the second electrical signal has the first signal characteristic or the second signal characteristic, outputting a logic high signal from the control circuit to the MEMS switching circuit when the second electrical signal has the first signal characteristic, and outputting a logic low signal from the control circuit to the MEMS switching circuit when the second electrical signal has the second signal characteristic. The logic high signal and the logic low signal selectively cause a voltage to be applied to a MEMS switch of the MEMS switching circuit so as to actuate the MEMS switch between a contacting position and a non-contacting position.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A switching system comprising:
  a switch connectable to a power circuit to receive a load current therefrom, the switch comprising one of an electrical switch, an electromechanical switch, a transistor, or a relay; and
  a control circuit operably connected to the switch to control selective switching of the switch, the control circuit comprising:
    control input terminals to receive an On-Off signal indicative of a desired operating state of the switch;
    control output terminals that transmit power and control signals to the switch responsive to the received On-Off signal;
    an oscillator coupled to the control input terminals and configured to generate a first electrical pulse responsive to the received On-Off signal, the first electrical pulse having one of a first signal characteristic and a second signal characteristic that is determined by the On-Off signal;
    a pulse transformer connected to receive the first electrical pulse from the oscillator and output a second electrical pulse electrically isolated from the first electrical pulse, the second electrical pulse having the same one of the first signal characteristic and the second signal characteristic as the first electrical pulse; and a pulse detection circuit configured to:
  receive the second electrical pulse;
  determine whether the second electrical pulse has the first signal characteristic or the second signal characteristic; and
  control transmission of power and control signals to the switch based on the determination of the second electrical pulse having the first signal characteristic or the second signal characteristic;

wherein the first signal characteristic comprises one of a first frequency and a first duty cycle and the second signal characteristic comprises one of a second frequency and a second duty.

2. The switching system of claim 1 wherein the switch comprises a micro-electromechanical system (MEMS) switching circuit including a MEMS switch and a MEMS driver circuit, and wherein the power and control signals transmitted to the MEMS switching circuit via the pulse detection circuit are transmitted to the MEMS driver circuit, which selectively provides a switching voltage to the MEMS switch to cause the MEMS switch to actuate to an open or closed position.

3. The switching system of claim 2 wherein, when the On-Off signal received by the oscillator is an On signal, the oscillator generates a first electrical pulse having the first signal characteristic.

4. The switching system of claim 3 wherein, when the pulse detection circuit determines the second electrical pulse has the first signal characteristic, the power and control signals transmitted to the MEMS switching circuit comprise logic high signals that cause the MEMS switch to actuate to the closed position.

5. The switching system of claim 2 wherein, when the On-Off signal received by the oscillator is an Off signal, the oscillator generates a first electrical pulse having the second frequency.

6. The switching system of claim 5 wherein, when the pulse detection circuit determines the second electrical pulse has the second signal characteristic, the power and control signals transmitted to the MEMS switching circuit comprise logic low signals that cause the MEMS switch to actuate to the open position.

7. The switching system of claim 2 further comprising an auxiliary circuit coupled in parallel with the MEMS switching circuit, the auxiliary circuit comprising solid state switching circuitry that is selectively activatable to divert at least a portion of the load current away from the MEMS switch to flow to the auxiliary circuit; and
  wherein the control circuit is operably connected to the auxiliary circuit, to provide power and control signals to selectively activate the solid state switching circuitry.

8. The switching system of claim 7 wherein the power and control signals transmitted to the MEMS switching circuit cause the MEMS switch to actuate to the open or closed position within a prescribed switching interval; and
  wherein the control circuit is programmed to:
    activate the auxiliary circuit during the switching interval when the MEMS switch is switching between the open and closed positions, such that at least a portion of the load current flows toward the auxiliary circuit; and
    deactivate the auxiliary circuit upon reaching the open or closed position after completion of the switching interval, such that the load current flows through the MEMS switch.

9. The switching system of claim 2 wherein the control circuit further comprises:
  a first capacitor positioned on a primary side of the pulse transformer;
  a second capacitor positioned on a secondary side of the pulse transformer; and
  a first diode positioned on the secondary side of the pulse transformer;
  wherein the first and second capacitors and the first diode operate with the pulse transformer such that the duty cycle and/or frequency of the second electrical pulse is the same as the duty cycle and/or frequency of the first electrical pulse.

10. The switching system of claim 9 wherein the control circuit further comprises a peak voltage detector including a second diode and a third capacitor, wherein an output of the peak voltage detector is provided to one of the output terminals to provide power to at least one of the MEMS driver circuit, the auxiliary circuit, and the pulse detection circuit.

11. The switching system of claim 9 wherein the control circuit further comprises a third diode and a resistor positioned on a secondary side of the pulse transformer such that the second electrical pulse is routed therethrough, with the second electrical pulse being routed out through the third diode and the resistor to the pulse detection circuit.

12. The switching system of claim 1 wherein the control circuit further comprises a driver coupled to an output of the oscillator, the driver boosting a current carrying capability to the first electrical pulse and providing a low voltage buffer in the control circuit.

13. A micro-electromechanical system (MEMS) relay circuit comprising:
  a MEMS switching circuit including:
    a MEMS switch moveable between an open position and a closed position to selectively pass a load current therethrough; and
    a MEMS driver circuit configured to provide a drive signal to cause the MEMS switch to move between the open and closed positions; and
  a control circuit operably connected to the MEMS switching circuit to control switching of the MEMS switch, the control circuit comprising:
    a pulse transformer configured to isolate a control side of the control circuit from a power side of the control circuit;
    an oscillator positioned on the control side and configured to generate a first electrical pulse responsive to a received On-Off signal, the first electrical pulse having one of a specified frequency and a specified duty cycle based on the On-Off signal, the specified frequency comprising one of a first frequency and a second frequency and the specified duty cycle comprising one of a first duty cycle and a second duty cycle; and
    power and logic circuitry positioned on the power side and configured to:
      condition an output of the pulse transformer to provide a second electrical pulse, the second electrical pulse having the same one of the specified frequency or specified duty cycle as the first electrical pulse;

determine whether the second electrical pulse is at the one of the specified first or second frequency or the specified first or second duty cycle; and transmit one of a logic high signal and a logic low signal to the MEMS switching circuit based on the determination of the second electrical pulse having the specified first or second frequency or the specified first or second duty cycle.

14. The MEMS relay circuit of claim 13 wherein the one of the logic high signal and the logic low signal transmitted to the MEMS driver circuit comprises a logic high signal when the second electrical pulse is determined to have the first frequency or first duty cycle, indicating receipt of an On signal at the oscillator, and comprises a logic low signal when the second electrical pulse is determined to have the second frequency or second duty cycle, indicating receipt of an Off signal at the oscillator.

15. The MEMS relay circuit of claim 14 wherein the MEMS driver circuit:

applies a high voltage to the MEMS switch when the transmitted signal is a logic high signal, the high voltage causing the MEMS switch to close; and applies zero voltage or a low voltage when the transmitted signal is a logic low signal, the zero or low voltage causing the MEMS switch to open.

16. The MEMS relay circuit of claim 13 wherein the power and logic circuitry comprises:

an arrangement of a first capacitor, a second capacitor, and a first diode positioned that collectively operate with the pulse transformer in order that the one of the frequency and the duty cycle of the second electrical pulse is the same as the one of the frequency and duty cycle of the first electrical pulse; and a pulse detection circuit that performs the determination of whether the second electrical pulse is at the specified first or second frequency or the specified first or second duty cycle and transmission of the one of the logic high signal and the logic low signal to the MEMS switching circuit.

17. The MEMS relay circuit of claim 16 further comprising an auxiliary circuit connected in parallel with the MEMS switching circuit to selectively limit a voltage across the MEMS switch, the auxiliary circuit comprising a first MOSFET and a second MOSFET connected in parallel; and wherein the control circuit is operably connected to the auxiliary circuit, to selectively activate the first MOSFET and the second MOSFET.

18. The MEMS relay circuit of claim 17 wherein the power and logic circuitry comprises a second diode and a third capacitor that collectively operate to detect peak voltage pulses and provide a supply power to at least one of the MEMS driver circuit, the auxiliary circuit, and the pulse detection circuit.

19. A method of controlling a micro-electromechanical system (MEMS) relay circuit that includes a MEMS switching circuit, an auxiliary circuit and a control circuit, the method comprising:

receiving at the control circuit one of an Off signal and an On signal comprising a desired operating condition of the MEMS relay circuit;

causing an oscillator in the control circuit to generate a first electrical signal responsive to the one of the Off signal and the On signal, the first electrical signal having a first signal characteristic when an On signal is received and having a second signal characteristic when an Off signal is received;

routing the first electrical signal through a pulse transformer to generate a second electrical signal that is electrically isolated from the first electrical signal, the second electrical signal having the same one of the first signal characteristic or the second signal characteristic as the first electrical signal;

determining via a pulse detection circuit whether the second electrical signal has the first signal characteristic or the second signal characteristic;

outputting a logic high signal from the control circuit to the MEMS switching circuit when the second electrical signal has the first signal characteristic; and outputting a logic low signal from the control circuit to the MEMS switching circuit when the second electrical signal has the second signal characteristic;

wherein the logic high signal and the logic low signal selectively cause a voltage to be applied to a MEMS switch of the MEMS switching circuit so as to actuate the MEMS switch between a contacting position and a non-contacting position; and wherein the first signal characteristic comprises one of a first frequency and a first duty cycle and the second signal characteristic comprises one of a second frequency and a second duty.

20. The method of claim 19 further comprising:

detecting a peak voltage of the second electrical signal via a peak voltage detector of the control circuit; and outputting a supply power from the peak voltage detector to at least one of the MEMS switching circuit and the auxiliary circuit.

* * * * *